United States Patent [19]
Ciccone

[11] Patent Number: 6,104,220
[45] Date of Patent: Aug. 15, 2000

[54] LOW POWER UNDERVOLTAGE DETECTOR WITH POWER DOWN MODE

[75] Inventor: John C. Ciccone, Scottsdale, Ariz.

[73] Assignee: VLSI Technology, Inc., San Jose, Calif.

[21] Appl. No.: 09/009,567

[22] Filed: Jan. 20, 1998

[51] Int. Cl.[7] .................................................... H03L 7/00
[52] U.S. Cl. .......................................... 327/143; 327/198
[58] Field of Search .................................... 327/142, 143, 327/198

[56] References Cited

U.S. PATENT DOCUMENTS

| | | | |
|---|---|---|---|
| 4,633,107 | 12/1986 | Norsworthy | 327/143 |
| 5,203,867 | 4/1993 | Love et al. | 327/143 |
| 5,396,115 | 3/1995 | Coffman et al. | 327/143 |

FOREIGN PATENT DOCUMENTS

| | | | |
|---|---|---|---|
| 2-123818 | 5/1990 | Japan | 327/143 |
| 5-22100 | 1/1993 | Japan | 327/143 |
| 5-175812 | 7/1993 | Japan | 327/143 |

*Primary Examiner*—Kenneth B. Wells
*Attorney, Agent, or Firm*—Burns Doane Swecker & Mathis L.L.P.

[57] ABSTRACT

A single-ended power supply under-voltage level detection circuit included first and second stages of devices stacks coupled between a power supply signal and a reference potential. As the power supply increases it overcomes device threshold voltages in the first stage causing it to enable the second stage. As the power supply signal continues to increase and reaches a second voltage level, the second stage outputs a level indicator signal which indicates that the power supply is greater than or equal to a predetermined voltage level. A power-down signal can be externally applied to devices in the first and second stages so as to disable the detection circuit no matter what the power supply signal level is. In addition, the detection circuit can be used in a power-on-reset (POR) circuit to detect when the power supply has reached a predetermined voltage level so as to cause the POR circuit to output a POR signal an extended time interval afterwards.

2 Claims, 2 Drawing Sheets

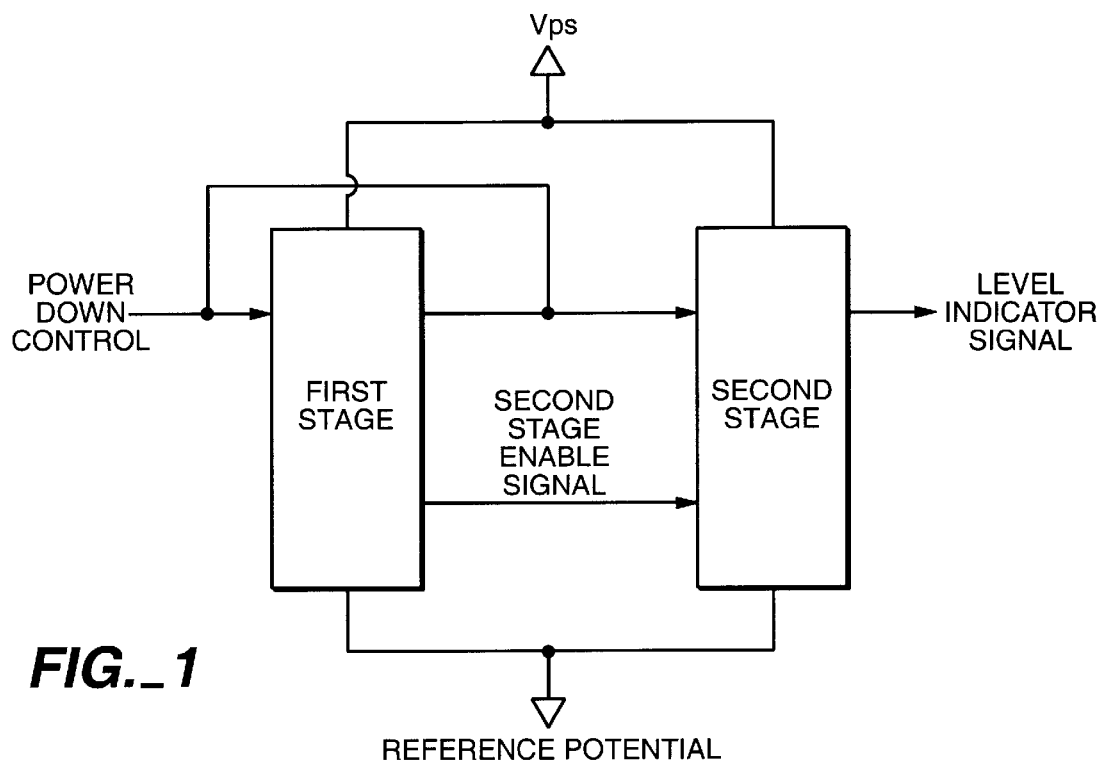
FIG._1
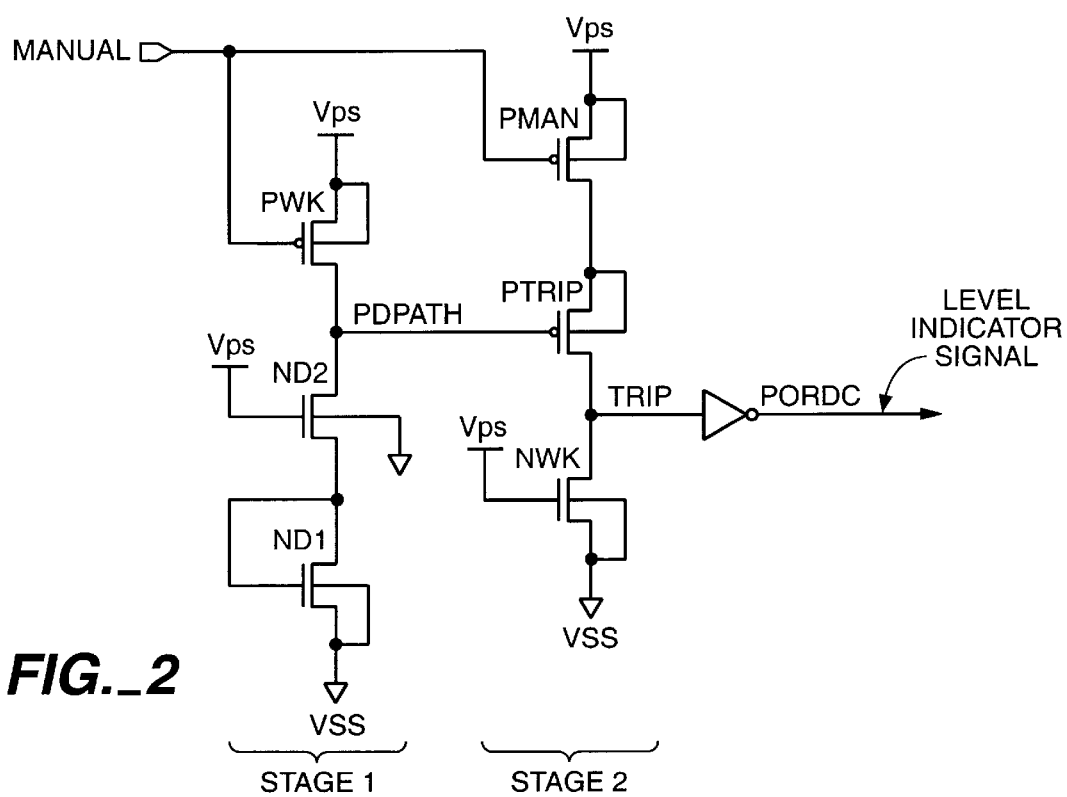
FIG._2

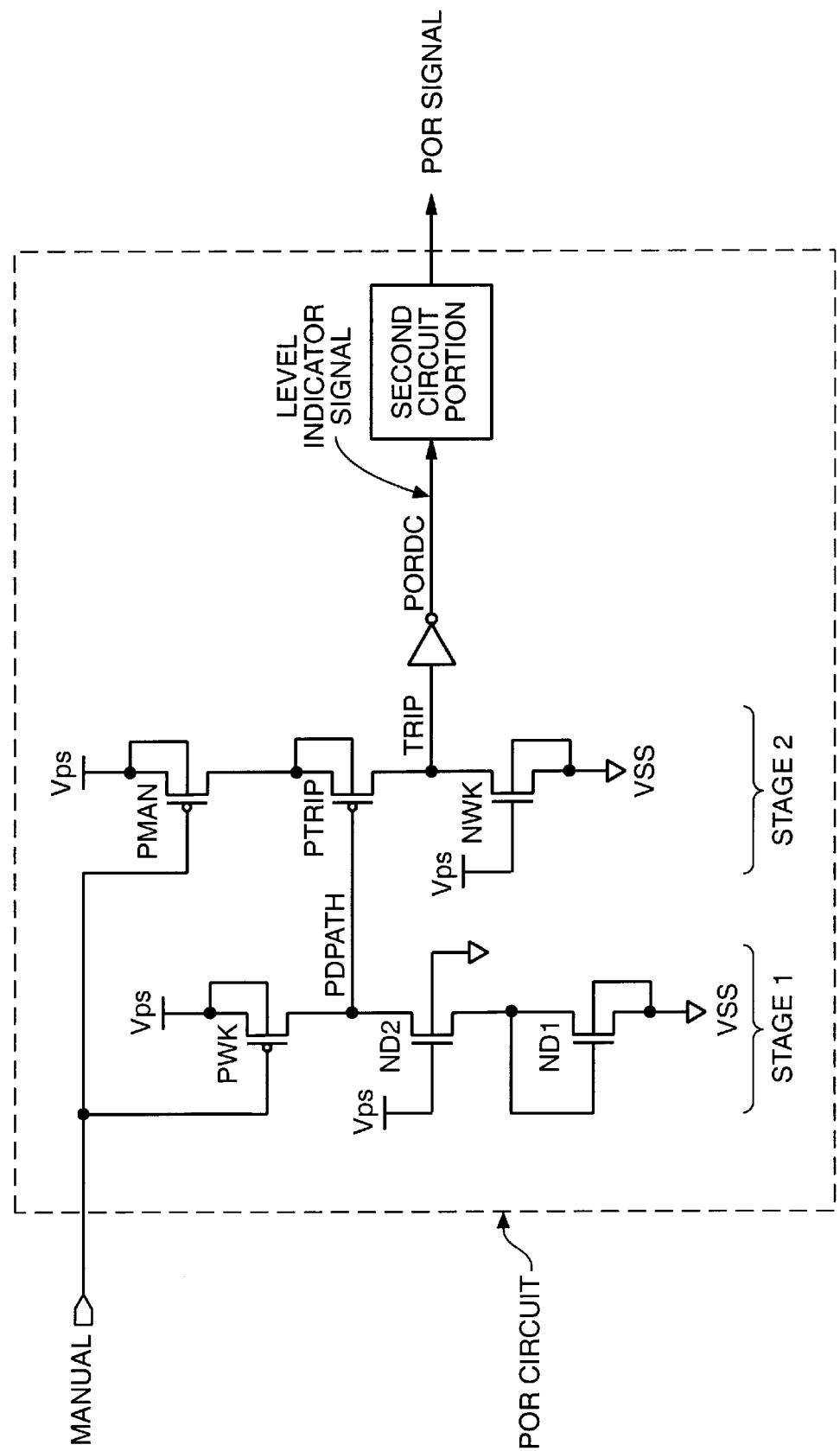
FIG._3

LOW POWER UNDERVOLTAGE DETECTOR WITH POWER DOWN MODE

BACKGROUND OF THE INVENTION

1. Field of the Invention

The present invention relates to voltage level detection circuits, and more particularly to power supply voltage level detection circuits used in power-on-reset circuits.

2. State of the Art

Voltage level detection circuits are used in integrated circuit (IC) devices to detect when the power supply reaches a particular level upon powering up the device or when the power supply drops below a certain level during operation or powering down. In general, voltage level detector designs include a differential input device that functions to compare the power supply (i.e., VDD) to a supply independent reference voltage to determine when the power supply has reached a minimum voltage level.

Often times voltage level detectors are used in power-on-reset (POR) circuits. POR circuits are often used when powering up digital ICs. The POR provides a delayed reset signal to portions of the IC to set logic within the circuit to a known state upon start-up. Specifically, when powering up an integrated circuit, the power supply voltage is often ramped up to the intended full level of the power supply voltage instead of directly applying full power. During this time, the integrated circuit is in an intermediate state and any reset signal generated while the circuit is being powered up may appear to be at a digital level other than the intended reset digital level. Consequently, the reset signal is generally provided to the remainder of the integrated circuit a short delay time after the power supply voltage has been applied to the power supply ports. The POR circuit includes a voltage level detector portion which detects when the power supply voltage has reached a predetermined voltage level as it is being ramped to full power. The remaining POR circuitry extends the application of the reset signal for a given amount of time after the level detection portion indicates the power supply has reached the predetermined voltage level.

One of the main disadvantages of currently used voltage level detectors is that it is dependent on the rate at which the power supply is ramped and this dependency can result in erroneous level detection results. In addition, these circuits dissipate power during times when level detection is not required.

The present invention is an improved voltage level detector design which obviates the need for generating a reference voltage by eliminating the differential input of the level detector and which includes a power-down mode for reducing power consumption.

SUMMARY OF THE INVENTION

The present invention, in general, is a single-ended input under voltage level detection circuit having a power-down mode.

In one embodiment, the voltage level detector includes first and second stages of device stacks coupled to the power supply and also coupled to the power-down mode control input signal. When the power-down control input signal is in a first state the detector circuit is deactivated and the detector provides a level detection signal indicating the power supply is below a predetermined voltage level. When the power-down control input signal is in a second state, the circuit is activated such that in a first case when the power supply signal is less than the predetermined voltage level, the voltage level detector provides a signal indicating that the power is less than the predetermined voltage level and in a second case, when the power supply reaches a voltage level dependent on threshold voltages of the first and second stacks of devices, the voltage level detector provides a signal indicating that the power supply is at a voltage greater than the predetermined voltage level.

The under voltage level detection circuit is particularly useful when implemented in a power-on-reset (POR) circuit. The level detection circuit can be used to provide a trip signal in the POR circuit and also provides the ability to shut-down the POR circuit into a power-down mode.

BRIEF DESCRIPTION OF THE DRAWINGS

The present invention may be further understood from the following written description in conjunction with the appended drawings.

FIG. 1 shows a block diagram of one embodiment of a voltage level detector having a single-ended input in accordance with the present invention;

FIG. 2 shows a schematic of a preferred embodiment of a voltage level detector in accordance with the present invention;

FIG. 3 shows the embodiment of the voltage level detector shown in FIG. 2 in a POR circuit.

DETAILED DESCRIPTION OF THE PREFERRED EMBODIMENTS

FIG. 1 shows an embodiment of a under voltage detection circuit in accordance with the present invention. The detection circuit functions such that it outputs a signal which indicates whether the power supply signal (Vps) is greater than or equal to a predetermined voltage level. The circuit includes first and second stages coupled between a power supply signal, Vps, and a reference potential VSS (e.g., ground). In general, upon powering up an integrated circuit, Vps is ramped from ground to a maximum DC level (i.e., VDD). Hence, in one embodiment, the power supply signal is one which is ramped from 0.0 volt to VDD. The first stage functions such that as Vps is ramped and reaches a first voltage level, it generates a second stage enable signal causing the second stage to be activated. As Vps continues to increase and reaches the predetermined voltage level, the second stage outputs a level indicator signal which indicates that Vps has reached the predetermined voltage level. The level detection circuit further includes a power-down mode in which a power down control signal is applied to the first and second stages such that when the power down control signal is asserted both of the first and second stages shutdown and do not dissipate power and the indicator signal indicates that Vps is less than the predetermined voltage level.

FIG. 2 shows a circuit schematic of a preferred embodiment of the voltage level detection circuit shown in FIG. 1 including first and second stages of device stacks. Stage 1 includes a first series coupled MOS device stack coupled between Vps and VSS including devices PWK, ND1, and ND2. PMOS device PWK has its gate coupled to power down control signal MANUAL, its source coupled to Vps and its drain coupled to node PDPATH. NMOS device ND2 has its gate coupled to Vps, its drain coupled to node PDPATH, and its source coupled to device ND1. NMOS device ND1 has its gate coupled to its drain and its source coupled to VSS.

Stage 2 includes a second series coupled MOS device stack coupled between Vps and VSS including devices PMAN, PTRIP, and NWK. PMOS device PMAN has its gate coupled to the power down control signal MANUAL, its source coupled to Vps, and its drain coupled to the source of device PTRIP. PMOS device PTRIP has its gate coupled to PDPATH and its drain coupled to a TRIP node. NMOS device NWK has its gate coupled to Vps, its drain coupled to the TRIP node and its source coupled to VSS.

In the case in which the power-down control signal MANUAL is LOW, the voltage detection circuit is not in power-down mode and devices PWK and PMAN are on. In addition, initially, with the Vps voltage level at zero volts, devices ND2 and ND1 are turned off. In order to turn devices ND2 and ND1 on, Vps must overcome a first voltage level approximately equal to two threshold voltages corresponding to the gate-to-source voltages of ND1 and ND2. Once the power supply reaches this first voltage level, devices ND1 and ND2 begin to conduct. Devices ND1 and ND2 are designed to be much greater in size than device PWK, such that as Vps continues to increase they overcome device PWK and pull node PDPATH towards VSS.

As the power supply continues to increase, devices ND2 and ND1 pull node PDPATH low so as to cause device PTRIP to begin to conduct. Device NWK has its gate coupled to the power supply and device PMAN has its gate coupled to the MANUAL signal such that each of these devices is also conducting. Devices PMAN and PTRIP are designed to be much greater in size than device NWK, such that as Vps continues to increase they overcome device NWK and pull the TRIP node towards the current voltage level of Vps. When the TRIP node reaches the trip level of the inverter, the level indicator signal is driven to a digital LOW voltage level indicating that Vps has reached the predetermined voltage level.

In the case in which the power-down control signal MANUAL is HIGH, devices PWK and PMAN are off causing the TRIP node to be at a LOW digital voltage level no matter what the voltage level of Vps is. Hence, when MANUAL is HIGH, the voltage level detector is disabled and does not dissipate power.

One advantage of this type of voltage detection circuit is that it obviates the prior art use of a differential circuit which compares the power supply signal to a supply independent reference voltage. As a result, the function of the voltage level detector is no longer dependent on the rate at which the power supply is ramped. Specifically, the power supply can be ramped up slowly or quickly with no effect on the operation of the voltage level detection circuit.

FIG. 3 shows the voltage level detection circuit as shown in FIG. 2 in a power-on-reset circuit which also includes a second circuit portion. In this embodiment of a POR circuit, when the power supply signal reaches the predetermined voltage level, the voltage detection circuit enables the second circuit portion via the voltage level indicator signal. Once enabled, the second circuit portion outputs a reset signal for a predetermined time interval.

Notable features of the single-ended input level detection circuit having power down mode include:

a manual power down mode which can be externally applied thereby shutting off the level detector to provide zero power dissipation and force a state of reset; and non-differential input voltage level detection circuit requiring no supply independent reference voltage for comparing to the power supply signal.

In the preceding description, numerous specific details are set forth, such as specific device sizes and voltages in order to provide a thorough understanding of the present invention. It will be apparent, however, to one skilled in the art that these specific details need not be employed to practice the present invention. In other instances, well known integrated circuit design theory have not been described in order to avoid unnecessarily obscuring the present invention.

Moreover, although the components of the present invention have been described in conjunction with certain embodiments, it is appreciated that the invention can be implemented in a variety of other ways. Consequently, it is to be understood that the particular embodiments shown and described by way of illustration are in no way intended to be considered limiting. Reference to the details of these embodiments is not intended to limit the scope of the claims which themselves recite only those features regarded as essential to the invention.

What is claimed is:

1. A power supply voltage detection circuit for detecting a voltage level of a power supply signal provided to an integrated circuit device, said detection circuit comprising:

a first stage comprising: a first device (PWK), a second device (ND2) and a third device (ND1), said first device having its source coupled to said power supply signal line (Vps) its gate coupled to a power down control signal line (MANUAL), and its drain coupled to an enable signal node (PDPATH), said second device having its gate coupled to said power supply signal line, and its drain coupled to said enable signal node, said third device having its source coupled to a reference potential and both its gate and drain coupled to said second device's source, wherein in response to said power supply signal (Vps) reaching a first voltage level and when said control signal line is in a first enabled state, said first stage generating an enable signal on said enable signal node;

a second stage comprising: a fourth device (PMAN), a fifth device (PTRIP) and a sixth device (NWK), said fourth device having its source coupled to said power supply signal line and its gate coupled to said power down control signal line, said fifth device having its gate coupled to said enable signal node, its source coupled to said fourth device's drain, and its drain coupled to a voltage level indicator node, said sixth device having its drain coupled to said voltage level indicator node, its gate coupled to said power supply signal line, and its source coupled to said reference potential, wherein when said second stage is enabled by said enable signal, when said control signal is in said first state, and when said power supply signal is at a second voltage level, said second stage outputs a level detection signal on said level indicator node indicating said power supply is greater than or equal to a predetermined voltage level;

and wherein when said power down control signal is in a second state, said detection circuit is disabled and not consuming power.

2. A circuit for generating a power-on-reset signal said circuit coupled to an associated power supply signal coupled to an integrated circuit device which is ramped to its full power, said circuit comprising:

a means for detecting when said power supply signal is at a predetermined voltage level and outputting a level indicator signal indicating said predetermined voltage level has been reached comprising:

a first stage including a first device (PWK), a second device (ND2) and a third device (ND1), said first device having its source coupled to said power supply signal line (Vps), its gate coupled to a power down control signal line (MANUAL), and its drain coupled to an enable signal node (PDPATH), said second device having its gate coupled to said power supply signal line, and its drain coupled to said enable signal node, said third device having its source coupled to a reference potential and both its gate and drain coupled to said second device's source, wherein in response to said power supply signal (Vps) reaching a first voltage level and when said control signal line is in a first enabled state, said first stage generating an enable signal on said enable signal node;

a second stage including a fourth device (PMAN). a fifth device (PTRIP) and a sixth device (NWK), said fourth device having its source coupled to said power supply signal line and its gate coupled to said power down control signal line, said fifth device having its gate coupled to said enable signal node, its source coupled to said fourth device's drain, and its drain coupled to a voltage level indicator node, said sixth device having its drain coupled to said voltage level indicator node, its gate coupled to said power supply signal line, and its source coupled to said reference potential, wherein when said second stage is enabled by said enable signal, when said control signal is in said first state, and when said power supply signal is at a second voltage level, said second stage outputs a level indicator signal on said level indicator node indicating said power supply is greater than or equal to a predetermined voltage level;

and wherein when said power down control signal is in a second state, said detection circuit is disabled and not consuming power; and a means for outputting said power-on-reset signal for a predetermined time interval in response to said level indicator signal.

* * * * *